United States Patent [19]
McGibney et al.

[11] Patent Number: 6,112,322
[45] Date of Patent: Aug. 29, 2000

[54] CIRCUIT AND METHOD FOR STRESS TESTING EEPROMS

[75] Inventors: Phillip H. McGibney, San Jose; Michael G. Ahrens, Sunnyvale, both of Calif.

[73] Assignee: Xilinx, Inc., San Jose, Calif.

[21] Appl. No.: 08/964,031

[22] Filed: Nov. 4, 1997

[51] Int. Cl.[7] .................................................. G11C 29/00
[52] U.S. Cl. ............................................ 714/721; 714/720
[58] Field of Search ............................... 365/221, 230.06, 365/230.09, 222, 189.05, 189.02; 324/158.1; 714/720, 718, 721

[56] References Cited

U.S. PATENT DOCUMENTS

| | | | |
|---|---|---|---|
| 4,597,062 | 6/1986 | Asano et al. ............................ | 365/201 |
| 4,683,555 | 7/1987 | Pinkham ................................. | 365/189.02 |
| 4,796,231 | 1/1989 | Pinkham ................................. | 365/189.05 |
| 4,831,594 | 5/1989 | Khosrovi et al. ....................... | 365/222 |
| 4,985,872 | 1/1991 | Halbert, III ............................ | 365/230.09 |
| 5,241,501 | 8/1993 | Tanaka .................................... | 365/201 |
| 5,258,954 | 11/1993 | Furuyama ............................... | 365/201 |
| 5,265,057 | 11/1993 | Furuyama et al. ..................... | 365/201 |
| 5,309,091 | 5/1994 | El-Ayat et al. ......................... | 324/158.1 |
| 5,457,696 | 10/1995 | Mori ........................................ | 714/720 |
| 5,583,816 | 12/1996 | McClure ................................. | 365/201 |
| 5,644,542 | 7/1997 | McClure et al. ....................... | 365/201 |
| 5,668,772 | 9/1997 | Hotta ....................................... | 365/230.06 |
| 5,818,776 | 10/1998 | Shibutani et al. ...................... | 365/221 |
| 6,003,149 | 12/1999 | Nevill et al. ............................ | 714/718 |

OTHER PUBLICATIONS

"The Programmable Logic Data Book", 1996, p. 4–28, available from Xilinx, Inc., 2100 Logic Drive, San Jose, California 95124.

*Primary Examiner*—Albert De Cady
*Assistant Examiner*—David Ton
*Attorney, Agent, or Firm*—Lois D. Cartier; Michael R. Casesy, Esq.; Oblon, Spivak, McClleland, Maier & Neustadt, P.C.

[57] ABSTRACT

A circuit and method are provided for stress-testing EEPROMS by incrementally selecting and deselecting word lines. The circuit of the invention comprises a memory cell array, a set of decoders for decoding a memory address bus and controlling word lines for the memory cell array, a control circuit, and a shift register driven by the control circuit. Each bit of the shift register has the capability of overriding a group of one or more of the decoders. When the initiation signal is received by the control circuit, a state control bit is set high and is clocked through the shift register. The high bit overrides successive groups of decoders as it is shifted through the shift register, until all word lines in the memory cell array are selected. After the stress test has been performed, the state control bit is returned to zero and is cycled through the shift register on successive clock cycles, incrementally deselecting groups of word lines until all word lines are deselected.

4 Claims, 3 Drawing Sheets

CIRCUIT AND METHOD FOR STRESS TESTING EEPROMS

BACKGROUND OF THE INVENTION

1. Field of the Invention

The invention relates to memory arrays in Integrated Circuits (ICs). More particularly, the invention relates to a circuit and method for incrementally selecting and deselecting groups of word lines in a Programmable Read-Only Memory (PROM) array, useful for stress testing Electrically Erasable PROMs (EEPROMs), for example.

2. Description of the Background Art

In IC memory arrays such as PROMs, situations arise in which it is desirable to perform an operation on all locations in the array. One such situation is that of performing a high voltage stress test on each location in an EEPROM array. Another is that of presetting all bit values in the array to a known value, such as zero.

FIG. 1 shows a prior art memory cell 200 for an EEPROM. Such a memory cell typically consists of a single storage transistor 201. During a read operation, storage transistor 201 either pulls precharged-high bit line BLB to ground GND, or leaves bit line BLB high. Storage transistor 201 is not a typical N-channel transistor, as storage transistor 201 has an extra polysilicon gate called a floating gate (FG). Floating gate FG determines the threshold of storage transistor 201, based on whether or not there is a charge on floating gate FG. Storage transistor 201 is also controlled by control gate CG, driven by word line WL.

When EEPROM memory cell 200 is not programmed, there is no charge stored on floating gate FG. The threshold of storage transistor 201 is about the same as that of a typical N-channel transistor. Therefore, when word line WL goes high (selecting memory cell 200), storage transistor 201 is turned on and bit line BLB is pulled low. The sensing circuit for the EEPROM interprets the low value on bit line BLB as a high bit value. Therefore, the unprogrammed value for the EEPROM memory cell is high.

When EEPROM memory cell 200 is programmed, a negative charge is placed on floating gate FG, raising the threshold of storage transistor 201. (EEPROM storage transistors, and methods for programming them, are well-known in the art of EEPROM design, and therefore are not described herein.) When word line WL goes high, storage transistor 201 does not turn on. Bit line BLB is not pulled low. The sensing circuit for the EEPROM interprets the high value on bit line BLB as a low bit value. Therefore, the programmed value for the EEPROM memory cell is low.

FIG. 2 shows a cross-sectional diagram of storage transistor 201 from EEPROM memory cell 200 of FIG. 1. Reference to FIG. 1 shows that one of the two diffusion regions N+ in substrate P is tied to ground GND, and the other to bit line BLB. An oxide layer OX1 (or other dielectric layers) separates control gate CG from floating gate FG. Oxide layer OX1 is typically about 200 angstroms thick (or the dielectric equivalent thereof) at point "a" between floating gate FG and control gate CG. An oxide layer OX2 separates floating gate FG from substrate P and diffusion regions N+. Oxide layer OX2 is typically about 90–120 Angstroms thick at point "b" between floating gate FG and substrate P. For the unprogrammed cell, if oxide layer OX2 is too thin or is otherwise defective, oxide layer OX2 may begin to break down and conduct an electrical charge. For the programmed cell, if oxide layer OX1 is too thin or is otherwise defective, a similar charge loss may occur. In either case, floating gate FG will not hold a negative charge and storage transistor 201 will cease to operate correctly. Therefore, it is desirable to have the capability of testing the integrity of oxide layers OX1 and OX2 at about the voltage level used while programming the EEPROM. Such a test is referred to as a "stress test". (The term "stress test" as used herein also includes testing the integrity of the oxide layers at a voltage level other than the programming voltage.)

A stress test is typically performed in an EEPROM by selecting a group of one or more word lines in the memory array and applying an overvoltage, suitable for stressing the oxide layers, to the selected word lines. (This overvoltage is typically the voltage level used while programming the EEPROM.) The values in the selected memory cells are then read back to determine whether the storage transistors still function correctly, i.e., whether the oxide layer has maintained its integrity. Another group of word lines is then selected, and the test is repeated. If there are many groups of word lines, the stress test can take an undesirably long time to complete.

It is desirable to perform operations such as stress tests in a short amount of time. Given only this consideration, such an operation could be performed in a single clock cycle on receiving a single initiating signal, by simultaneously selecting all word lines in the EEPROM memory cell array. However, switching all word lines simultaneously might result in a large power surge that could burn out the metal power lines in the IC. It is known that having a large number of simultaneous voltage transitions in an IC is undesirable. For example, to reduce ground bounce caused by the simultaneous switching of large numbers of I/O, the Xilinx XC4000-family devices introduce a deliberate, unclocked skew in the enablement of I/O buffers. (This method is described on page 4–28 of the Xilinx 1996 Data Book entitled "The Programmable Logic Data Book", available from Xilinx, Inc., 2100 Logic Drive, San Jose, Calif. 95124, which page is incorporated herein by reference. (Xilinx, Inc., owner of the copyright, has no objection to copying this and other pages referenced herein but otherwise reserves all copyright rights whatsoever.)) It would be desirable to eliminate potentially destructive power surges during EEPROM stress tests, while reducing the amount of time required to perform a stress test on the memory array.

SUMMARY OF THE INVENTION

The invention provides a circuit and method for incrementally selecting and deselecting word lines, thereby enabling the performance of stress tests in EEPROMs without the power surge that would result from simultaneously switching all word lines in the EEPROM memory array. A method is provided for selecting and deselecting word lines in groups of one or more, on receipt of a single initiating signal. The circuit of the invention comprises a memory cell array, a set of decoders for decoding a memory address bus and controlling word lines for the memory cell array, a control circuit, and a shift register driven by the control circuit. Each bit of the shift register has the capability of overriding a group of one or more of the decoders.

When the stress test initiation signal is received by the control circuit, a state control bit is set high and is clocked into (latched into) the first bit of the shift register (which was initially set to all zeros). The high bit in the first location of the shift register overrides the first group of decoders, selecting the word lines controlled by these decoders. On the next active clock edge, the high bit is loaded into the second bit of the shift register, selecting the second group of word lines, and so on until all word lines in the memory cell array are selected. The stress test is then performed on the entire array simultaneously, reducing the time required to perform the test compared to prior art methods of performing the test on relatively small portions of the array at a time. After the stress test is complete, the state control bit is returned to zero and is cycled through the shift register on successive clock cycles, incrementally deselecting groups of word lines until all word lines are deselected.

According to a second aspect of the invention, the circuit and method of the invention can be applied to clearing a memory cell array by incrementally selecting and deselecting word lines.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

A circuit and method for stress testing EEPROMs by incrementally selecting and deselecting groups of word lines according to the invention is described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
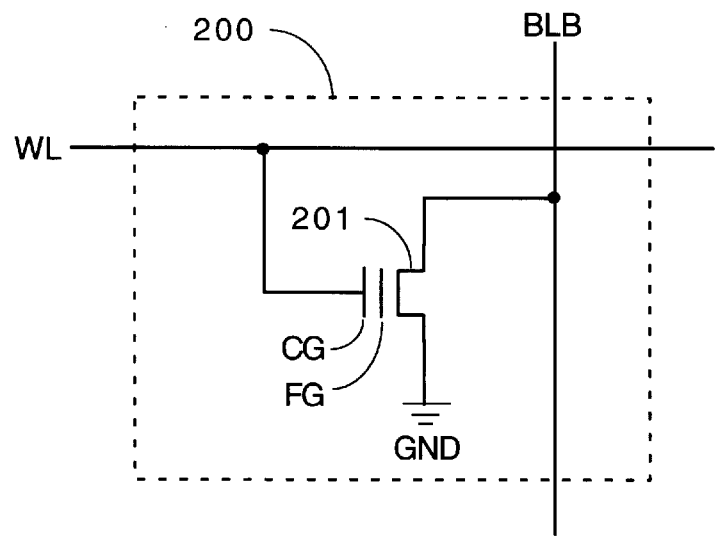
FIG. 1 shows a prior art memory cell for an EEPROM.
Figure 2:
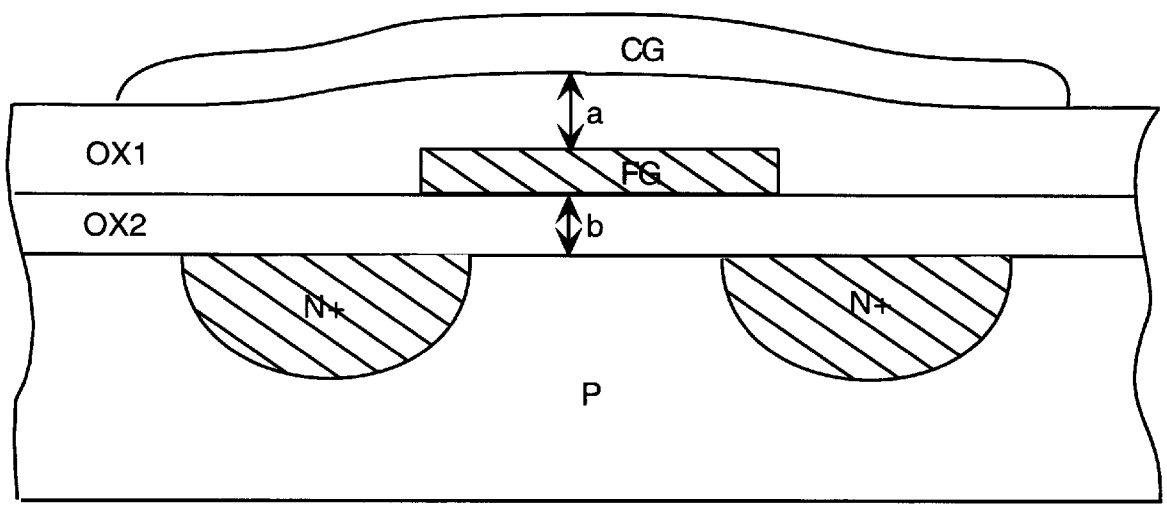
FIG. 2 shows a cross-sectional diagram of a prior art storage transistor from the EEPROM memory cell of FIG. 2.
Figure 3:
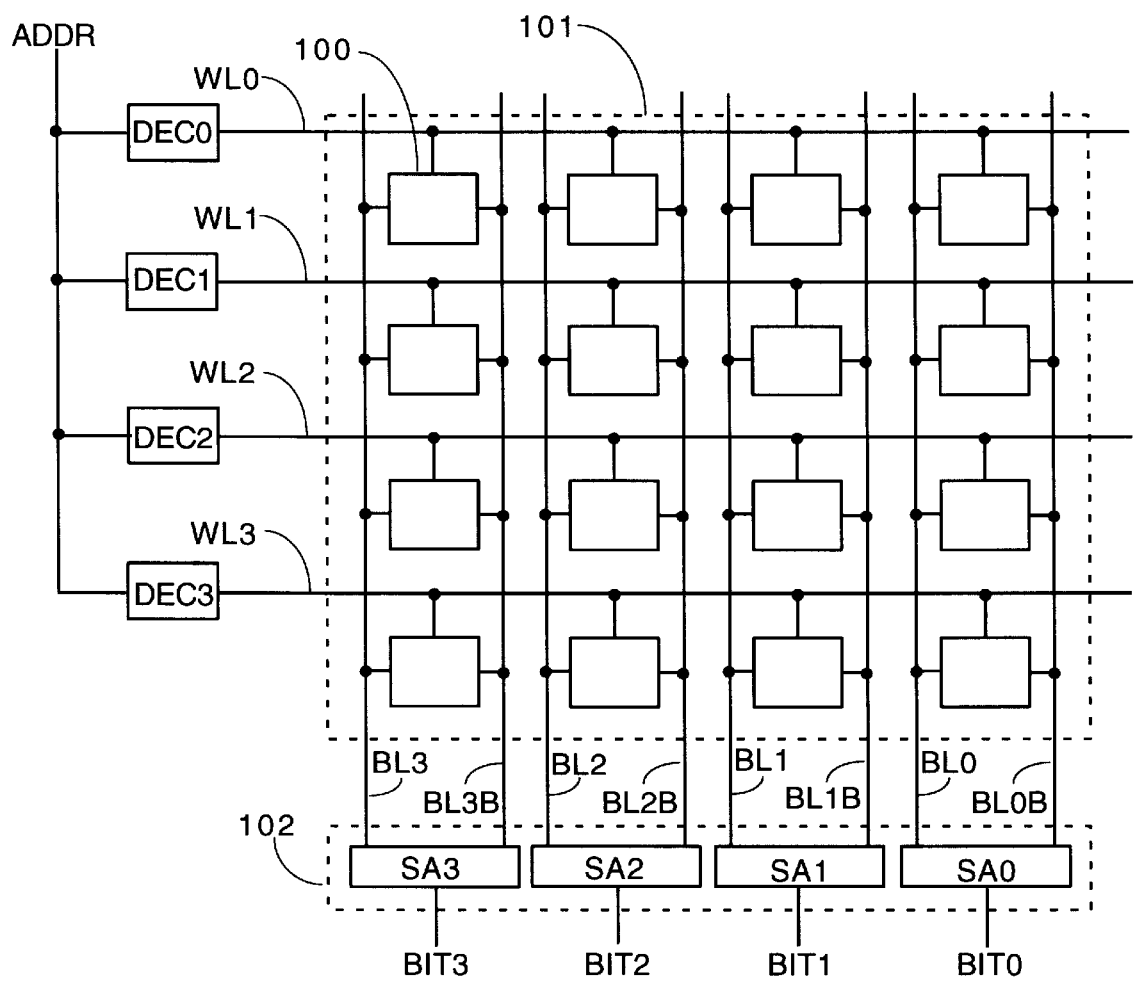
FIG. 3 shows a prior art memory array comprising an array of memory cells addressed by a set of word lines.

As shown in FIG. 3, memory arrays typically comprise an array 101 of memory cells 100 addressed by a set of word lines (WL0, WL1, WL2, WL3). (Memory arrays are typically much larger than the 4×4 array shown in FIG. 3. An atypically small array is shown in order to simplify the drawing.) Each memory cell typically has two input/outputs (I/Os), the bit stored therein and the complement value of that bit. For example, memory cell 100 has two I/Os tied to bit lines BL3 and BL3B. Each word line WL0, WL1, WL2, WL3 selects one row of memory cells. Each bit line BL3, BL3B, BL2, BL2B, BL1, BL1B, BL0, BL0B accesses any of a column of memory cells. The active memory cell in each column is selected by means of the word lines, at most one word line typically being active at a given time. The active word line is selected by means of decoder circuits DEC0, DEC1, DEC2, DEC3 decoding address information on memory address bus ADDR. Each pair of bit lines drives a sense amplifier in sensing circuit 102. For example, bit lines BL3, BL3B drive sense amplifier SA3. During a read operation, the selected word line connects one memory cell to each pair of bit lines. The sense amplifiers detect a higher voltage on one bit line in each pair than on the other bit line in the same pair, and latch either a "high" value or a "low" value for each bit based on whether the true or complement bit line, respectively, is at a higher voltage. The set of latched bit values BIT3, BIT2, BIT1, BIT0 forms the "word" read from the memory. Some memory cells have only a single bit line, which is precharged high and then is pulled low or not pulled low based on the contents of the selected memory cell. During a write operation, the bit lines are externally driven (circuitry not shown in FIG. 3) in order to write data into the selected row of the memory cell array.

Figure 4:
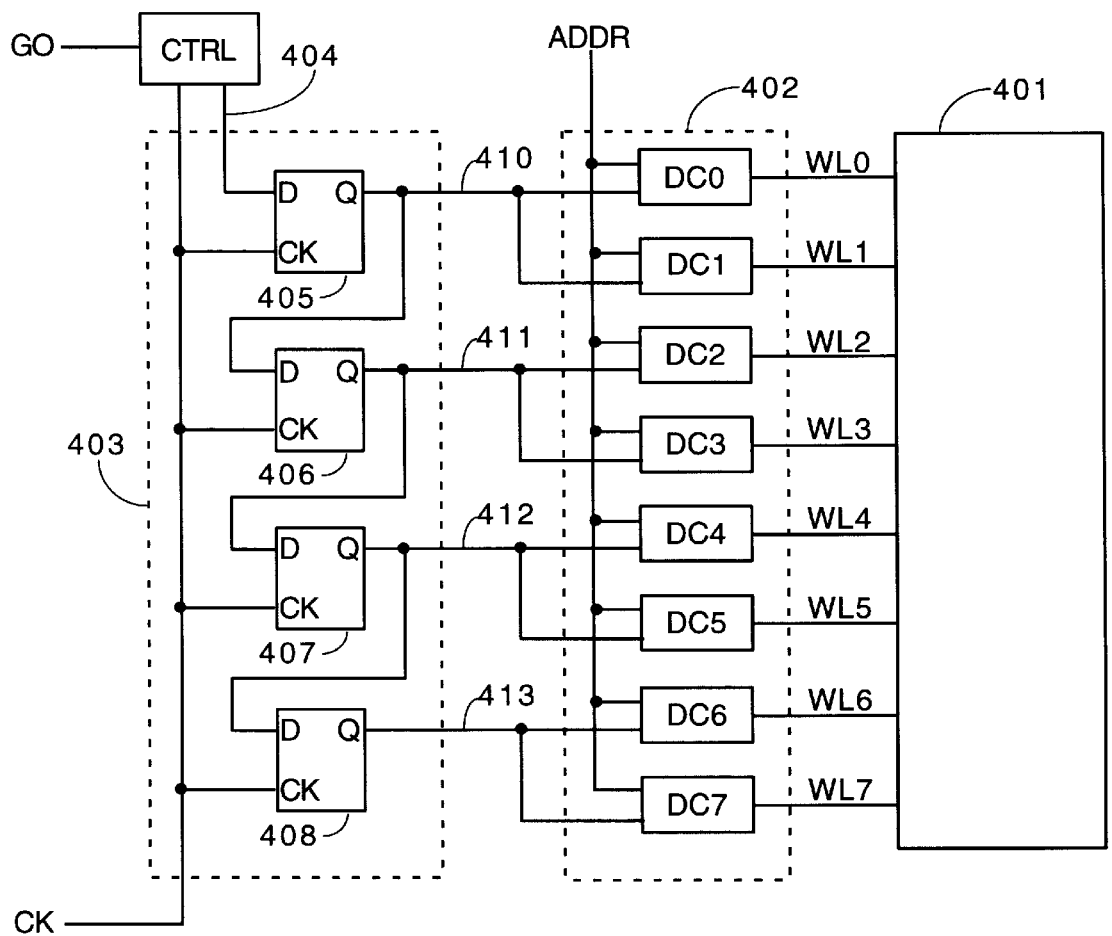
FIG. 4 shows a circuit according to the invention which incrementally selects and deselects word lines in groups of two.

FIG. 4 shows a circuit according to one embodiment of the present invention. The circuit of FIG. 4 comprises memory cell array 401, a set of decoders 402 (comprising decoders DC0, DC1, . . . , DC7) for decoding memory address bus ADDR and controlling word lines WL0, WL1, . . . , WL7 for memory cell array 401, control circuit CTRL, and shift register 403 driven by control circuit CTRL. Each bit of shift register 403 (stored in flip-flops 405, 406, 407, 408) has the capability of overriding a group of one or more of the decoders. For example, flip-flop 405 output 410 provides an override input for decoders DC0 and DC1. Therefore, when flip-flop 405 output 410 is high, word lines WL0 and WL1 (outputs of decoders DC0, DC1, respectively) are selected regardless of the value on memory adddress bus ADDR.

When the initiation signal is received by control circuit CTRL (e.g., when signal GO goes high), state control bit 404 is set high and is clocked by clock CK into flip-flop 405, the first bit of shift register 403. (All bits in shift register 403 were initially set low.) Flip-flop 405 output 410 goes high, decoders DC0, DC1 are overridden, and word lines WL0, WL1 are both selected (i.e., in this embodiment both of word lines WL0, WL1 go high). (Word lines that go high at approximately the same time in response to a single overriding signal are referred to herein as a group. Therefore, word lines WL0, WL1 form a group with flip-flop output 410 as an override signal. A group can have one or more members.)

On the next active clock edge, the high bit in flip-flop 405 is loaded through output 410 into flip-flop 406, the second bit of shift register 403. When flip-flop 406 output 411 goes high, decoders DC2, DC3 are overridden and word lines WL2, WL3 are selected. Because state control bit 404 is still high, another high bit is clocked into flip-flop 405 and word lines WL0, WL1 remain selected. On the following active clock edge, flip-flop 407 output 412 goes high and word lines WL4, WL5 are selected. Similarly, on the following active clock edge, flip-flop 408 output 413 goes high and word lines WL6, WL7 are selected. At this time in the test cycle, all word lines in memory cell array 401 are selected.

According to a first aspect of the invention, applicable to EEPROMs, at this point in the test cycle the clock is stopped and the positive power supply voltage (VPP) driving the word lines is raised close to the programming voltage level (in one embodiment, where the programming voltage level is 12 volts, to about 12 volts) to stress the oxide. The positive power supply voltage is then reduced to the level of the positive voltage supply (VCC), the clock is restarted, and the initiating signal GO returns to a low value.

When initiating signal GO returns to a low value, state control bit 404 is also set low. The low value is cycled through shift register 403. At each clock cycle, another group of word lines is incrementally deselected in the same order in which they were selected, to complete the stress test cycle. The contents of the memory array are then read to see if the programming of the memory cells was affected by the high voltage on the charging gates.

Stress tests can also be performed using power supply voltages other than the programming voltage of the preferred embodiment. For example, a zero voltage or any positive voltage up to about the programming voltage can be applied to the word lines during the performance of the stress test.

According to a second aspect of the invention, applicable to all types of memory arrays, all bit lines are pulled low prior to initiating signal GO going high. As each group of word lines is selected, the memory cells selected by those word lines are reset to zero. Therefore the steps described above perform a reset on the entire memory cell array, while avoiding a potentially destructive power surge.

In one embodiment, each flip-flop 405, 406, 407, 408 in shift register 403 has a reset input, which is used to ensure that each bit in shift register 403 is low prior to beginning a stress test cycle. In another embodiment, when an insufficient number of clock edges are supplied to complete a stress test cycle in progress, the control circuitry does not permit the memory array to be read until the stress test cycle is complete. Read clocks are interpreted as test cycle clocks until all word lines are deselected. This protective mechanism prevents the power surge that could result from a premature read occurring while multiple word lines are still selected.

The embodiment of FIG. 4 shows a small memory array with only eight word lines. A memory with only eight word lines probably would not display the problem with power surges for which the invention is a remedy. Most memory cell arrays, however, are much larger than the embodiment shown in FIG. 4. In one embodiment, a memory cell array is supplied having 16 groups, each of 16 word lines. This memory cell array could not successfully perform a stress test as described unless the method of the invention were employed. Thus it will be understood that the present invention provides a useful and novel circuit and method for incrementally selecting and deselecting word lines.

Since the stress test can be initiated by receipt of a single signal, the circuit and method of the invention are particularly advantageous for serial EEPROMs, which have a limited number of I/O pins.

A further advantage of the invention is that the control circuit, shift register and overridable decoders of the invention can be applied to existing memory cell arrays, without redesign of the existing memory cells.

The above text describes the circuit and method of the invention in the context of memory arrays in EEPROMs. However, the invention can also be applied to other memories, including non-erasable programmable memories and random access memories (RAMs). For example, IC RAMs are typically tested by placing overvoltages on bit lines. The method of the present invention can be applied to such RAM arrays by first applying the overvoltage to all bit lines for the array, then incrementally selecting groups of word lines until the overvoltage is applied to the entire array.

Those having skill in the relevant arts of the invention will now perceive various modifications and additions which may be made as a result of the disclosure herein of preferred embodiments. For example, while still selecting the word lines incrementally, the shift register could modified so that all bits are reset when the state control bit goes low, and all word lines are deselected simultaneously rather than incrementally. As a further example, the circuit of the invention could be applied to only some of the word lines in a memory array, rather than to all such word lines. Additionally, when the invention is applied to setting all bits in a memory cell array to a known value, the state control bit could be set back to zero after a single clock cycle, so that only one group of word lines is selected at a given time. Accordingly, all such modifications and additions are deemed to be within the scope of the invention, which is to be limited only by the appended claims and their equivalents.

What is claimed is:

1. A method for testing oxide integrity in an EEPROM, comprising the steps of:
   a) programming a test data pattern into at least a portion of an EEPROM memory array addressed by word lines;
   b) receiving an initiating signal;
   c) latching a state control bit in response to the initiating signal;
   d) loading the latched state control bit into a first bit of a shift register to invert the shift register bit;
   e) using the newly inverted shift register bit to override one or more of a set of decoders each driving one of the word lines, thereby selecting one or more word lines;
   f) shifting bit values within the shift register by one bit;
   g) repeating steps e) and f) until all of the word lines for the test data pattern are selected;
   h) raising a voltage level on the word lines to stress the oxide;
   i) lowering the voltage level to a level of a positive voltage supply;
   j) deselecting the selected word lines; and
   k) reading the test data pattern from the EEPROM memory array to verify proper functionality of the stressed oxide.

2. The method of claim 1, wherein step j) comprises the steps of:
   j1) inverting the state control bit;
   j2) loading the inverted state control bit into the first bit of the shift register to invert the shift register bit a second time;
   j3) using the newly re-inverted shift register bit to deselect one or more word lines;
   j4) shifting the bit values within the shift register by one bit; and
   j5) repeating steps j3) and j4) until all of the previously selected word lines are deselected.

3. A method for testing an integrity of oxide of floating gates of memory cells in a memory array of an EEPROM, wherein the EEPROM further includes decoders and word lines for actuating the memory cells, the method comprising the steps of:
   a) programming a test data pattern into at least a portion of the memory array;
   b) receiving an initiating signal;
   c) latching a state control bit in response to the initiating signal;
   d) loading the latched state control bit into a first bit of a shift register to invert the shift register bit;
   e) using the newly inverted shift register bit to override one or more of a set of decoders each driving one of the word lines, thereby selecting one or more word lines;
   f) shifting bit values within the shift register by one bit;
   g) repeating steps e) and f) until all of the word lines for the test data pattern are selected;
   h) raising a voltage level on the word lines to stress the oxide;
   i) lowering the voltage level to a level of a positive voltage supply;
   j) deselecting the selected word lines; and k) reading the portion of the memory array corresponding to the test data pattern to verify that the test data pattern is still stored in said portion of the memory array.

4. The method of claim 3, wherein step j) comprises the steps of:

j1) inverting the state control bit;

j2) loading the inverted state control bit into the first bit of the shift register to invert the shift register bit a second time;

j3) using the newly re-inverted shift register bit to deselect one or more word lines;

j4) shifting the bit values within the shift register by one bit; and j5) repeating steps j3) and j4) until all of the previously selected word lines are deselected.

* * * * *